United States Patent
Matthews et al.

(10) Patent No.: US 7,257,115 B2
(45) Date of Patent: Aug. 14, 2007

(54) DATA MEMORY ADDRESS GENERATION FOR TIME-SLOT INTERCHANGE SWITCHES

(75) Inventors: Frank Matthews, Alpharetta, GA (US); Dave MacAdam, Atlanta, GA (US)

(73) Assignee: Integrated Device Technology, Inc., San Jose, CA (US)

( * ) Notice: Subject to any disclaimer, the term of this patent is extended or adjusted under 35 U.S.C. 154(b) by 1251 days.

(21) Appl. No.: 10/205,177

(22) Filed: Jul. 25, 2002

(65) Prior Publication Data

US 2004/0017697 A1  Jan. 29, 2004

(51) Int. Cl.
  *H04L 12/50* (2006.01)
(52) U.S. Cl. ............................. 370/376; 370/382
(58) Field of Classification Search ............ None
  See application file for complete search history.

(56) References Cited

U.S. PATENT DOCUMENTS

| | | | |
|---|---|---|---|
| 4,093,827 A | 6/1978 | Charransol et al. | |
| 4,510,597 A | 4/1985 | Lewis | |
| 4,759,010 A | 7/1988 | Murata et al. | |
| 4,759,012 A | 7/1988 | Suzuki | |
| 4,805,172 A | 2/1989 | Barbe et al. | |
| 4,860,281 A | 8/1989 | Finley et al. | |
| 4,905,226 A | 2/1990 | Kobayashi | |
| 5,060,227 A | 10/1991 | Finley et al. | |
| 5,381,406 A | 1/1995 | Yamashita | |
| 5,521,928 A | 5/1996 | Worsley et al. | |
| 5,621,720 A | 4/1997 | Bronte et al. | |
| 5,862,136 A * | 1/1999 | Irwin | 370/395.4 |
| 5,959,977 A * | 9/1999 | Park | 370/263 |
| 6,067,296 A | 5/2000 | Heering et al. | |
| 6,160,807 A | 12/2000 | Zdenek et al. | |
| 6,178,184 B1 | 1/2001 | Petty | |
| 6,226,288 B1 | 5/2001 | Allen | |
| 6,628,652 B1 * | 9/2003 | Chrin et al. | 370/386 |
| 6,901,077 B1 * | 5/2005 | Jones | 370/442 |
| 6,944,153 B1 * | 9/2005 | Buckland et al. | 370/376 |
| 7,042,892 B2 * | 5/2006 | Young et al. | 370/419 |
| 2002/0176410 A1 | 11/2002 | McAdams et al. | |

OTHER PUBLICATIONS

Agere Systems "Excerra-16 TTSI01664 Time-Slot Interchanger (TSI)" Product Brief Jun. 2001.
Agere Systems "Excerra-144 TTSI14464 Time-Slot Interchanger (TSI)" Product Brief Jun. 2001.
IDT "3.3 Volt Time Slot Interchange Digital Switch" Product Specifications Mar. 2002 30 pages.
IDT Data Sheet "3.3 Volt Time Slot Interchange Digital Switch, 128×128" Aug. 2001 11 pages.

* cited by examiner

*Primary Examiner*—Phirin Sam
(74) *Attorney, Agent, or Firm*—Myers Bigel Sibley & Sajovec PA

(57) ABSTRACT

Time-slot interchange (TSI) switches and a pipelined data memory address generation circuit are provided. The TSI switches and the pipelined data memory address generation circuit include a first pipeline stage that reads data from a connection memory. A second pipeline stage compares the data read from the connection memory to provide a bank selection value. Optionally, a third pipeline stage reads data from a data memory based on the bank selection value and the data read from connection memory. The timing of the pipeline stages may be adjusted such that the duration of the first pipeline stage is extended and the duration of the second pipeline stage shortened.

39 Claims, 5 Drawing Sheets

DATA MEMORY ADDRESS GENERATION FOR TIME-SLOT INTERCHANGE SWITCHES

FIELD OF THE INVENTION

The present invention relates to integrated circuit devices and methods of operating same, and more particularly to integrated circuit switches that receive and transmit serial data streams and methods of operating same.

BACKGROUND OF THE INVENTION

Conventional time-slot interchange switches utilize a data memory and a connection memory to control how data passes through the switch. Examples of time-slot interchange (TSI) switch include those described in U.S. Pat. No. 4,510,597 and U.S. Pat. No. 4,093,827. In particular, the connection memory provides addresses to read data from the data memory so as to control the flow of data from inputs of the TSI switch to outputs of the TSI switch.

A circuit for providing data memory addresses in a TSI switch is illustrated in FIG. 1. In FIG. 1, a connection memory read counter 10 and an MPU address buffer 12 provide address values to a multiplexer 14. The MPU address buffer 12 is provided to allow microprocessor access to the connection memory 22. The multiplexer 14 provides a selected one of the output of the connection memory read counter 10 and the MPU address buffer 12 to a predecoder circuit 16. The predecoder provides an address which is clocked into the register 18 on a first clock cycle. The address stored in the register 18 is decoded by decoder 20 and a read of the connection memory 22 is initiated. The data read from the connection memory is stored in a temporary register 24 for use if a microprocessor access is being performed. The output of the connection memory 22 and the temporary register 24 are provided to the multiplexer 26. The temporary register 24 output, however, is only used on a cycle following a microprocessor tick and is not selected by the multiplexer 26 on two subsequent clock cycles. The multiplexer 26 is, therefore, controlled to select the output of the connection memory 22 on cycles other than the cycle immediately following a microprocessor tick and to select the output of the temporary register 24 on the cycle after a clock tick corresponding to a microprocessor access (a microprocessor tick). The output of the mutliplexer 26 is provided to the mutliplexer 30. The multiplexer 30 also receives the output of the MPU address buffer 12. The multiplexer 30 is controlled to select the output of the MPU address buffer during the microprocessor tick and, otherwise, to select the output of the mutliplexer 26.

During operations when a microprocessor access is not performed, the multiplexer 26 provides the direct output of the connection memory 22 or the output of the temporary register 24 to the multiplexer-30. The multiplexer 32 and the comparator 34 receive the output of the multiplexer 30 which provides either the output of a MPU Address buffer 12 or the selected output of the multiplexer 26. For data memory write operations where a microprocessor access is not performed, the multiplexer 32 provides the output of the data memory counter 28. For data memory read operations where a microprocessor access is not performed, the multiplexer 32 provides the output of multiplexer 30 to the register 40.

The address comparator 34 compares the output of the connection memory 22 and the data memory counter 28 and provides a bank selection value that is stored in the bank register 38. Similarly, the output of the connection memory 22 is provided to the register 40 that provides its contents to the predecoder 36. The predecoder 36 provides a predecoded address to the decoder 42. The bank register 38 and the register 40 are both clocked during a second clock cycle which is a next subsequent clock cycle to the first clock cycle during which the register 18 is clocked. Thus, the address decode, the connection memory read access and the address compare take less than one clock cycle.

The output of the register 40 is provided to the predecoder 36 that provides its output to a decoder 42, the output of which is provided to the data memory 44. The bank register 38 output is also provided to the data memory 44 for the read operation. The output of the data memory 44 is provided to a parallel-to-serial converter to provide the output of the TSI switch.

As seen in FIG. 1, the data memory read address generation circuit may be considered as including two pipeline stages 50 and 60. As used herein, the term "pipeline stage" refers to operations that are performed between a clock which initiates operations of a first portion of a circuit and a separate clock that initiates operations of a second portion of the circuit. Thus, a pipeline stage may have a duration from a first clock that initiates operations of the pipeline stage to a second clock that initiations operations of the next subsequent pipeline stage. Operations of the pipeline stage are, therefore, initiated with each occurrence of the clock associated with the pipeline stage and terminated upon each occurrence of the clock of the next subsequent pipeline stage. Thus, in FIG. 1, a first pipeline stage 50 is provided between the register 18 and the bank register 38 and register 40. A second pipeline stage 60 is provided from the bank register 38 and address 40. Thus, the first pipeline stage 50 provides for the read of the connection memory, the address compare and the predecode of the data memory read address. The second pipeline stage 60 provides for the decode of the data memory read address and the read of the data memory.

Furthermore, in the system illustrated in FIG. 1, the clocks of the two pipeline stages are synchronized such that the two pipeline stages have equal duration corresponding to one period of the synchronized clocks.

While the system of FIG. 1 provides for reads of the data memory 44 based on the output of the connection memory 22, as the speed and/or size of the TSI switch increases, the time provided for the operations of any of the particular pipeline stages, such as the first pipeline stage 50, may decrease. Such timing constraints may limit the speed and/or size of the TSI switch. Thus, notwithstanding conventional techniques to provide data memory addresses from a connection memory, such techniques may be insufficient as the speed and/or size of TSI switches increase.

SUMMARY OF THE INVENTION

Time-slot interchange (TSI) switches according to embodiments of the present invention include a pipelined data memory address generation circuit. The pipelined data memory address generation circuit includes a first pipeline stage that reads data from a connection memory. A second pipeline stage compares the data read from the connection memory to a write pointer location to provide a bank selection value. A third pipeline stage reads data from a data memory based on the bank selection value and the data read from connection memory.

In particular embodiments of the present invention, the first pipeline stage includes a first register that receives a read address and stores the read address during a first clock cycle and a decoder that decodes the read address stored in the first register and provides a decoded read address to the connection memory.

Additionally, the second pipeline stage can include a second register that receives an output of the connection memory and stores the output of the connection memory during a second clock cycle. An address comparator compares the output of the connection memory stored in the second register to a current write address value of the data memory and provides results of the comparison as a bank select value to the third pipeline stage. The second pipeline stage may also include a predecoder that predecodes the output of the connection memory stored in the second register and provides the predecoded results to the third pipeline stage.

In still further embodiments of the present invention, the third pipeline stage includes a bank select register that receives the bank select value and stores the bank select value during a third clock cycle and provides the stored bank select value to the data memory. A third register receives the predecoded results and stores the predecoded results during the third clock cycle. A decoder decodes the predecoded results stored in the third register to provide an address to the data memory.

In additional embodiments of the present invention, a timing circuit that provides the first clock cycle and the second clock cycle such that a duration between the first clock cycle and the second clock cycle is greater than a duration between a first occurrence of the first clock cycle and next subsequent occurrence of the first clock cycle. The timing circuit may also provide the first clock cycle, the second clock cycle and the third clock cycle such that a duration from the first clock cycle to the second clock cycle is greater than a duration from the second clock cycle to the third clock cycle. The third clock cycle may occur about two periods of the first clock cycle after initiation of the first clock cycle. Alternatively, the third clock cycle may be more than two periods of the first clock cycle after initiation of the first clock cycle.

In still further embodiments of the present invention, a temporary register receives and stores the output of the connection memory and selectively provides the stored output of the connection memory to the second register. A data memory counter may also provide the current write address of the data memory to the address comparator.

In additional embodiments of the present invention, a data memory address generation circuit of a time-slot interchange switch is provided that includes a connection memory, a data memory counter, an address comparator that compares a value read from the connection memory with a value from the data memory counter, a first register operably associated with the connection memory to store a value read from the connection memory and provide stored connection memory values on subsequent clock cycles to the address comparator, a second register operably associated with the first register that stores a value based on the value stored in the first register, a data memory address decode circuit operably associated with the second register to receive a value stored in the second register and a bank register operably associated with the address comparator that stores the output of the address comparator and provides the stored value to a data memory.

The data memory address generation circuit may also include a multiplexer operably associated with the data memory counter and the first register to selectively provide one of an output of the data memory counter and the value stored in the first register to provide a value on which the value stored in the second register is based. A predecoder operably associated with the multiplexer and the second register may also be provided to provide a predecode of the value stored in the second register.

In additional embodiments of the present invention, a connection memory address register that stores a connection memory address is also provided. The connection memory address may be provided by a connection memory read counter. A connection memory address decode circuit operably associated with the connection memory and the connection memory address register receives the stored connection memory address for reading the connection memory.

The address generation circuit may also include a clocking circuit that provides a first clock that clocks the connection memory address register, a second clock that clocks the first register and a third clock that clocks the second register. The clocking circuit may be configured so that a corresponding third clock clocks the second register about two periods of the first clock after initiation of a corresponding occurrence of the first clock. The clocking circuit may also be configured so that a time from initiation of a first occurrence of the first clock to a corresponding initiation of the second clock and is greater than a period of the first clock. Furthermore, the clocking circuit may be configured so that a time from the initiation of the second clock to a corresponding initiation of the third clock is less than the time from initiation of a first occurrence of the first clock to a corresponding initiation of the second clock and is greater than a period of the first clock. The clocking circuit may also be configured so that the time from the initiation of the second clock to a corresponding initiation of the third clock is less than a period of the first clock.

The data memory address generation circuit may also include a temporary register operably associated with the connection to store values read from the connection memory and a multiplexer configured to selectively provide an output of the temporary register or an output of the connection memory to the first register.

In further embodiments of the present invention, a method of generating an address for accessing a data memory of a time-slot interchange switch is provided by generating an address for accessing the data memory utilizing at least two pipeline stages, wherein a first of the at least two pipeline stages reads data from a connection memory and a second of the two pipeline stages provides a comparison of the data read from the connection with a current data memory write address.

In particular embodiments of the present invention, the first of the two pipeline stages stores a connection memory read address in a first register utilizing a first clock, decodes the connection memory read address stored in the first register during a period of the first clock to provide a decoded connection memory read address and reads data from the connection memory utilizing the decoded connection memory read address during the period of the first clock.

Furthermore, the second of the two pipeline stages may store data read from the connection memory in a second register utilizing a second clock and generate a bank select value by comparing the data stored in the second register with a current data memory write address. The second of the two pipeline stages may also predecode the data stored in the second register to provide a predecoded data memory read address. Storing data read from the connection memory in a second register utilizing a second clock may be provided by storing data read from the connection memory in a second register utilizing a second clock that is initiated more than the period of the first clock after initiation of the first clock.

In further embodiments of the present invention, a third pipeline stage stores the bank select value in a bank select register utilizing a third clock, stores the predecoded data memory read address in a third register utilizing the third clock, decodes the predecoded data memory read address stored in the third register to provide a decoded data memory read address during a period of the third clock and reads the data memory utilizing the stored bank select value and the decoded data memory read address during the period of the third clock.

Additionally, storing data read from the connection memory in a second register utilizing a second clock may be provided by storing data read from the connection memory in a second register utilizing a second clock that is initiated more than the period of the first clock after initiation of the first clock. Storing the bank select value and storing the predecoded data memory read address may be provided by storing the bank select value and the predecoded data memory read address utilizing a third clock that is initiated about two periods of the first clock after initiation of the first clock.

In still additional embodiments of the present invention, data read from the connection memory is stored in a temporary register and selectively provided to the second register.

Additionally, a duration of time of the first pipeline stage may be greater than a duration of time of the second pipeline stage.

In still further embodiments of the present invention, a time-slot interchange switch includes a connection memory and a data memory. A connection-to-data memory pipeline has at least first and second stages that are synchronized with a clock signal and consecutively traversed during first and second time intervals. The first and second time intervals having a duration greater than T and less that T respectively, where T is a period of the clock signal.

In certain embodiments of the present invention, the sum of the duration of the first time interval and the duration of the second time interval equals 2T. Furthermore, the connection-to-data memory pipeline may have three stages that are synchronized to the clock signal.

Figure 1:
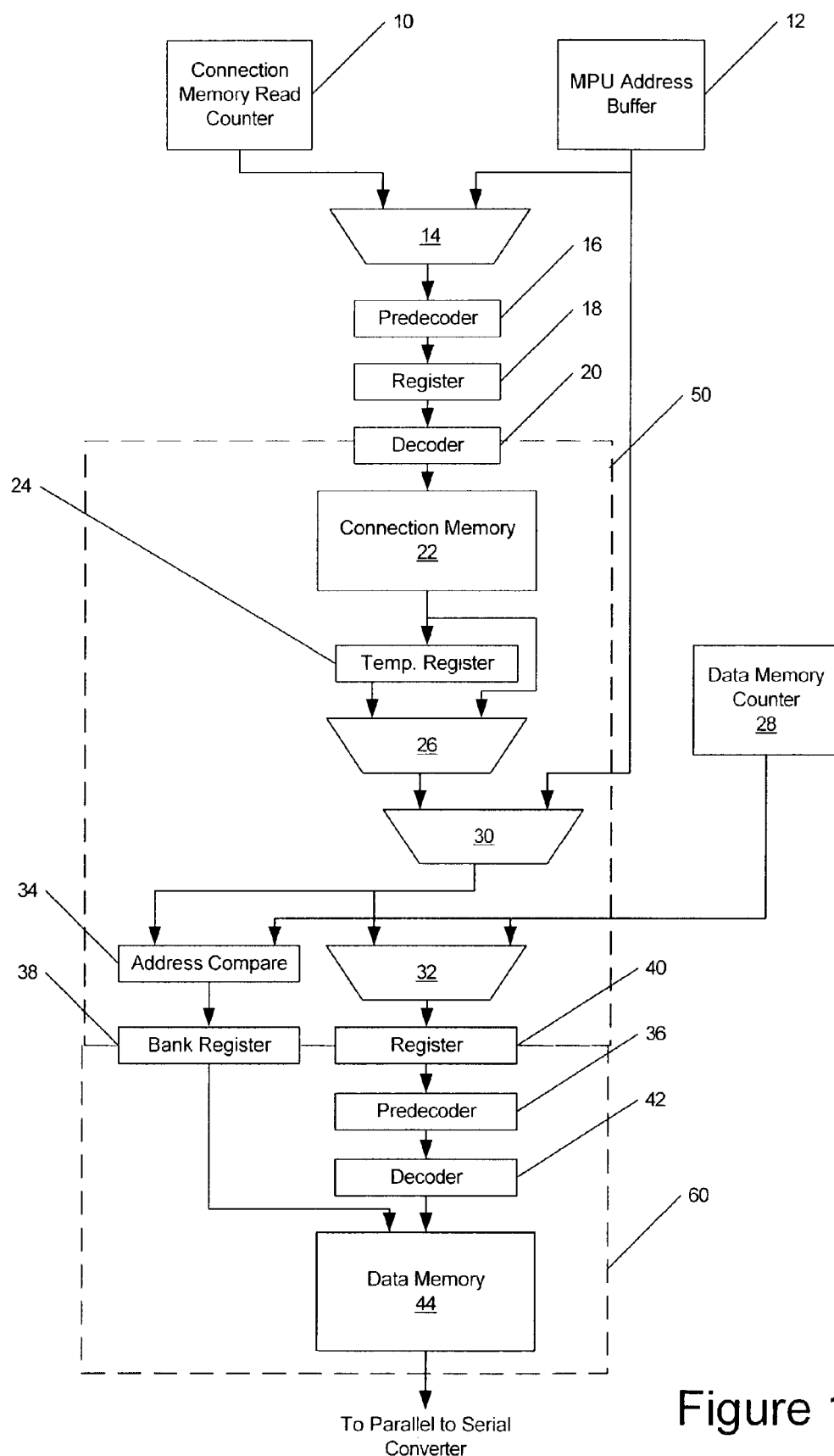
FIG. 1 is a block diagram that illustrates a conventional circuit for generating data memory addresses from a connection memory of a TSI switch.

DESCRIPTION OF PREFERRED
EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Signal lines and signals thereon may be referred to by the same reference characters. Like numbers refer to like elements throughout. Numeric values for various components of the preferred embodiments are also provided for purposes of illustration only and should not be used to limit the scope of the illustrated embodiments or claims.

Figure 2:
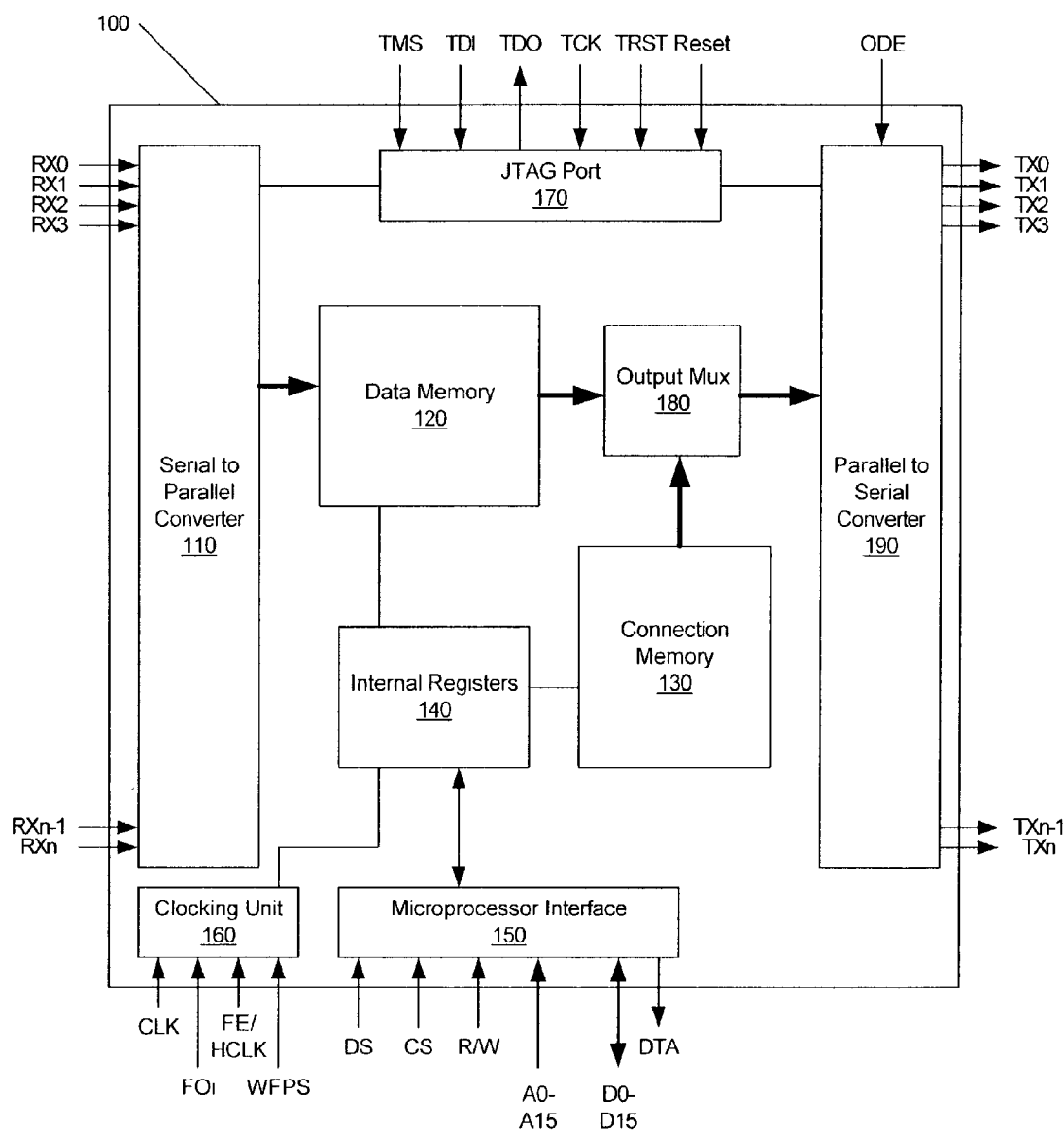
FIG. 2 is a block diagram of a time-slot interchange switch.

FIG. 2 illustrates a time-slot interchange (TSI) switch 100 according to embodiments of the present invention. As seen in FIG. 2, the TSI switch 100 includes a serial to parallel converter 110 which converts serial data received at the serial inputs RX0-RXn and provides the parallel data to a data memory 120. The data is read from the data memory 120 based on data stored in the connection memory 130. Such data stored in the connection memory 130 may be written to the connection memory through the microprocessor interface 150. The connection memory 130 is read and provides address and/or mode information to the registers 140. Mode information refers to values utilized to set the mode of operation of the TSI switch 100 as described further herein. The registers 140 provide a data memory read address to the data memory 120 based on the information read from the connection memory 130. The data read from the data memory 120 is provided to the output multiplexer (MUX) 180 which provides the output data to a parallel to serial converter 190 to provide the outputs TX0-TXn.

Also illustrated in FIG. 2 is a microprocessor interface 150 that provides access to the data memory 120 and the connection memory 130 by a microprocessor. A clocking unit 160 provides internal timing of the TSI switch 100 based on external clocks. A JTAG port 170 provides boundary scan test capabilites for the switch 100.

With regard to specific inputs and outputs of the switch 100, A0-A15 are address lines to access all internal memories. While a 16 bit address has been illustrated in FIG. 2, other numbers of address bits may be utilized, for example, 32 or 64 bits. CLK is the serial clock for shifting data in/out on the serial data streams. The device may be programmed to accept different frequencies of the clock CLK.

CS is the chip select and is used by a microprocessor to activate the microprocessor port of the switch 100. D0-D15 are the data bus data bits of the microprocessor interface 150. While 16 parallel bits of data are been illustrated in FIG. 2, other numbers of data bits may be utilized, for example, 32 or 64 bits. DS is the data strobe and works in conjunction with CS to enable the read and write operations and enables the data bus lines (D0-D15). DTA indicates that a data bus transfer is complete. WFPS is the wide frame pulse select input. When the WFPS pin is LOW, FE/HCLK is the frame measurement input. When the WFPS pin is HIGH, FE/HCLK is an input for receiving a clock for frame alignment in the wide frame pulse mode (WFPS). ODE is the output drive enable and provides the output enable control for the TX serial outputs. RESET places the switch 100 into a reset state that clears the device internal counters, registers and brings TX0-TXn and D0-D15 into a high-impedance state. R/W controls the direction of the data bus lines (D0-D15) during a microprocessor access. TCK provides the clock to the JTAG test logic. TDI provides an input for JTAG serial test instructions and data. TDO provides an output for JTAG serial data on the falling edge of TCK. TMS is a JTAG signal that controls the state transitions of the TAP controller. TRST asynchronously initializes the JTAG TAP controller by putting it in the Test-Logic-Reset state. FOi is the Frame Pulse and indicates the start of a frame.

Figure 3:
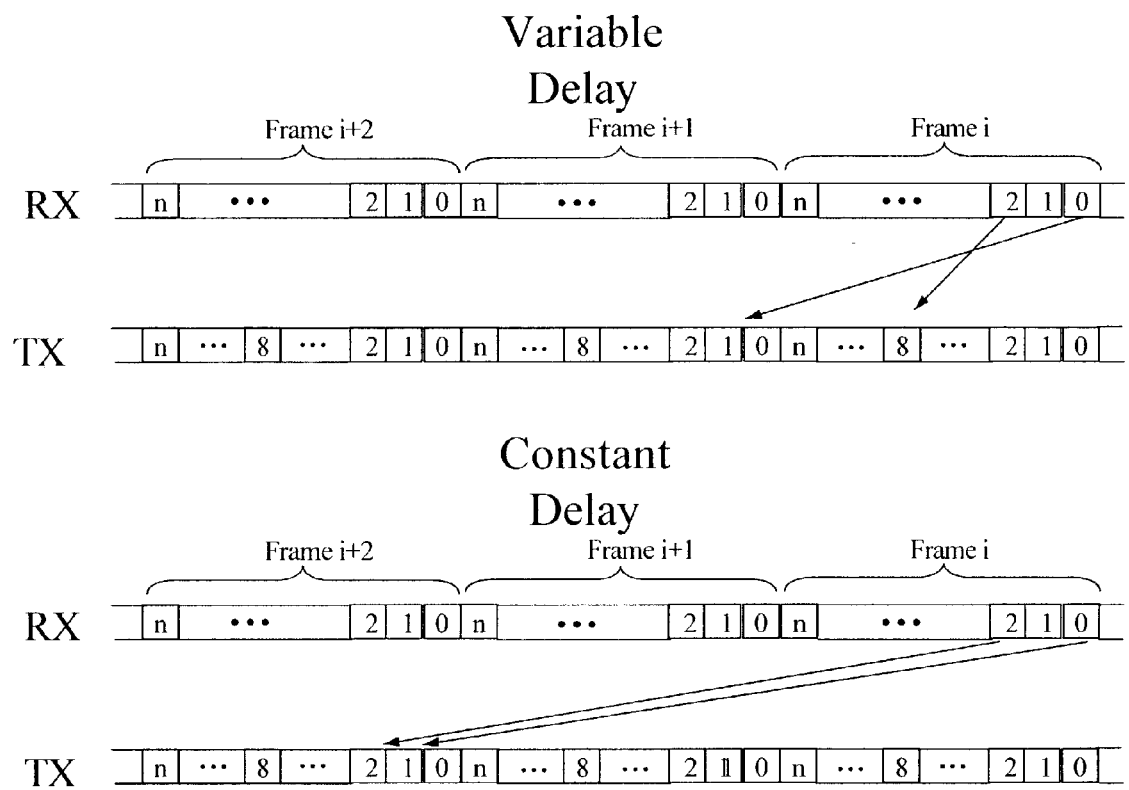
FIG. 3 is a diagram illustrating constant delay mode operation of a time-slot interchange switch and illustrating variable delay mode operation of a time-slot interchange switch.

In particular embodiments of a TSI switch 100 according to the present invention, the data passing through the TSI switch 100 may have a constant delay from frame to frame or a variable delay from frame to frame. The mode of operation may be selected through the microprocessor interface 150 by, for example, setting mode select bits in the connection memory to select between variable delay mode, constant delay mode and processor mode. Fixed and variable delays are illustrated in FIG. 3. As is seen in FIG. 3, with a variable delay, data from a particular location in a received frame, such as Frame i, may be provided to any location of a subsequently transmitted frame. Thus, for example, channel 0 of Frame i may be placed in channel 8 of an output frame. Similarly, data from channel 2 to Frame i is placed in channel 1 of a subsequent output frame. As can be seen in FIG. 3, the delay provided to channel 2 and to channel 0 of Frame i differ, thus providing a variable delay. The latest channel is always provided. In variable delay mode a minimum of 3 channel delays is provided.

Constant delay mode is also illustrated in FIG. 3. Constant delay mode ensures frame integrity by keeping a constant frame latency for all channels. Thus, in the constant delay mode example, channels received in Frame i are transmitted in Frame i+2. For example, channel 0 in Frame i may be transmitted in channel 1 (or any other channel) in Frame i+2.

To provide variable delay mode a comparator is provided between the connection memory and the data memory. The TSI switch may store multiple frames of received data and selectively transmits from these multiple frames of data. The comparator compares the most recent data memory write address to the data from the connection memory to select which of multiple stored frames of data should be accessed. Merely placing the comparator between the connection memory and the data memory as illustrated in FIG. 1, however, may result in timing difficulties as the connection memory is read and the address is compared in a single clock cycle.

Figure 4:
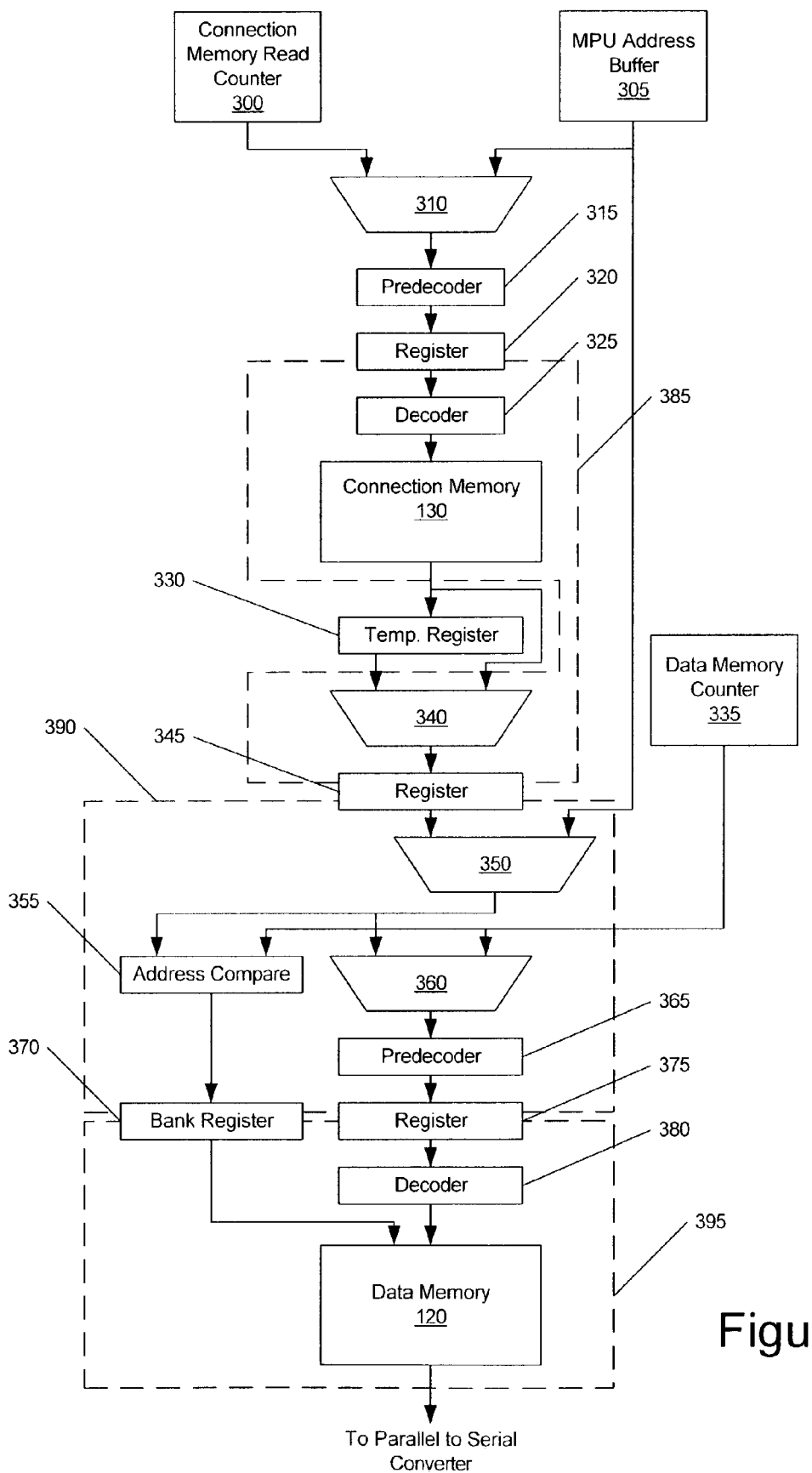
FIG. 4 is a block diagram of a read pipeline according to embodiments of the present invention.

FIG. 4 illustrates a data memory address generation circuit that may provide for variable delay mode and for 3 frame latency in constant delay mode. As seen in FIG. 4, the data memory address is generated utilizing a first pipeline stage 385 which provides data from connection memory 130 and a second pipeline stage 390 which performs the address compare and, optionally, predecode of the data from the connection memory 130. A third pipeline stage 395 is also illustrated in FIG. 4 and provides for the access of the data memory 120.

Turning to the specifics of the data memory address generation circuit of FIG. 4, a connection memory read counter 300 and an MPU address buffer 305 provide address values to a multiplexer 310. The MPU address buffer 305 is provided to allow microprocessor access to the connection memory 130. The multiplexer 310 provides a selected one of the output of the connection memory read counter 300 and the MPU address buffer 305 to a predecoder circuit 315. In particular embodiments of the present invention, the multiplexer 310 provides the address value from either connection memory read counter 300 and/or the output of the MPU address buffer 305 to the predecoder 315 depending on whether a microprocessor access is being performed.

The predecoder 315 provides an address which is clocked into the register 320 on a first clock cycle. The address stored in the register 320 is decoded by decoder 325 and a read of the connection memory 130 is initiated. The data of the read operation from the connection memory 130 is stored in a temporary register 330 if a microprocessor access is being performed. The output of the connection memory 130 and the temporary register 330 are provided to the multiplexer 340. During operations when a microprocessor access is not performed, the multiplexer 340 provides the direct output of the connection memory 130 to the register 345. The register 345 clocks the data in on a second clock cycle that is, typically, a next subsequent clock cycle to the first clock cycle that clocks the register 320. The multiplexer 340 selects the output of the temporary register 330 for one clock cycle after a microprocessor access for a connection memory read operation. The select signal may also be active to select the temporary register 330 during a microprocessor access. Otherwise, the mutliplexer 340 selects the direct output of the connection memory 130.

The output of the register 345 is provided to the multiplexer 350. The multiplexer 350 also receives the output of the MPU address buffer 305. The output of the multiplexer 350 is provided to the multiplexer 360 and to the address comparator 355. The multiplexer 360 and the comparator 355 also receive the output of a data memory counter 335. For normal read operations, the multiplexer 350 provides the output of the register 345. Thus, the multiplexer 350 selects the output of the MPU address buffer 305 during a microprocessor and, otherwise, selects the output of the register 345.

The address comparator 355 compares the output of the register 345 and the data memory counter 335 and provides a bank selection which is stored in the bank register 370. Similarly, during a non-microprocessor read of the data memory, the multiplexer 360 provides the output of the register 345, through the multiplexer 350, to the predecoder 365. The mutliplexer 360 selects the output of the data memory counter 335 (i.e. a current write pointer) for write operations and, otherwise, selects the output of the multiplexer 350.

The predecoder 365 provides an address to the register 375. The bank register 370 and the register 375 are both clocked with a third clock cycle that is, typically, a next subsequent clock cycle to the second clock cycle that clocks the register 345. The output of the register 375 is provided to a decoder 380, the output of which is provided to the data memory 120. The bank register 370 output is also provided to the data memory 120 for the read operation. The output of the data memory 120 is provided to a parallel to serial converter to provide the output of the TSI switch, for example, through the multiplexer 180 of FIG. 2.

The connection memory read counter 300, the MPU address buffer 305, the multiplexer 310, the predecoder 315, the register 320, the temporary register 330, the data memory counter 335, the multiplexer 340, the multiplexer 350, the register 345, the address comparator 355, the multiplexer 360, the predecoder 365, the bank register 370 and the register 375 may be provided as part of the internal registers 140 and/or the microprocessor interface 150 illustrated in FIG. 2. Similarly, the decoder 325 and the decoder 380 may be provided as part of the respective connection memory 130 and/or data memory 120 and/or as part of the internal registers 140 if FIG. 2. However, other distributions of circuits, functions and/or operations may also be utilized while still benefitting from the teachings of the present invention. Thus, the present invention should not be construed as limited to the particular configurations illustrated in FIG. 2 and/or FIG. 4.

Figure 5:
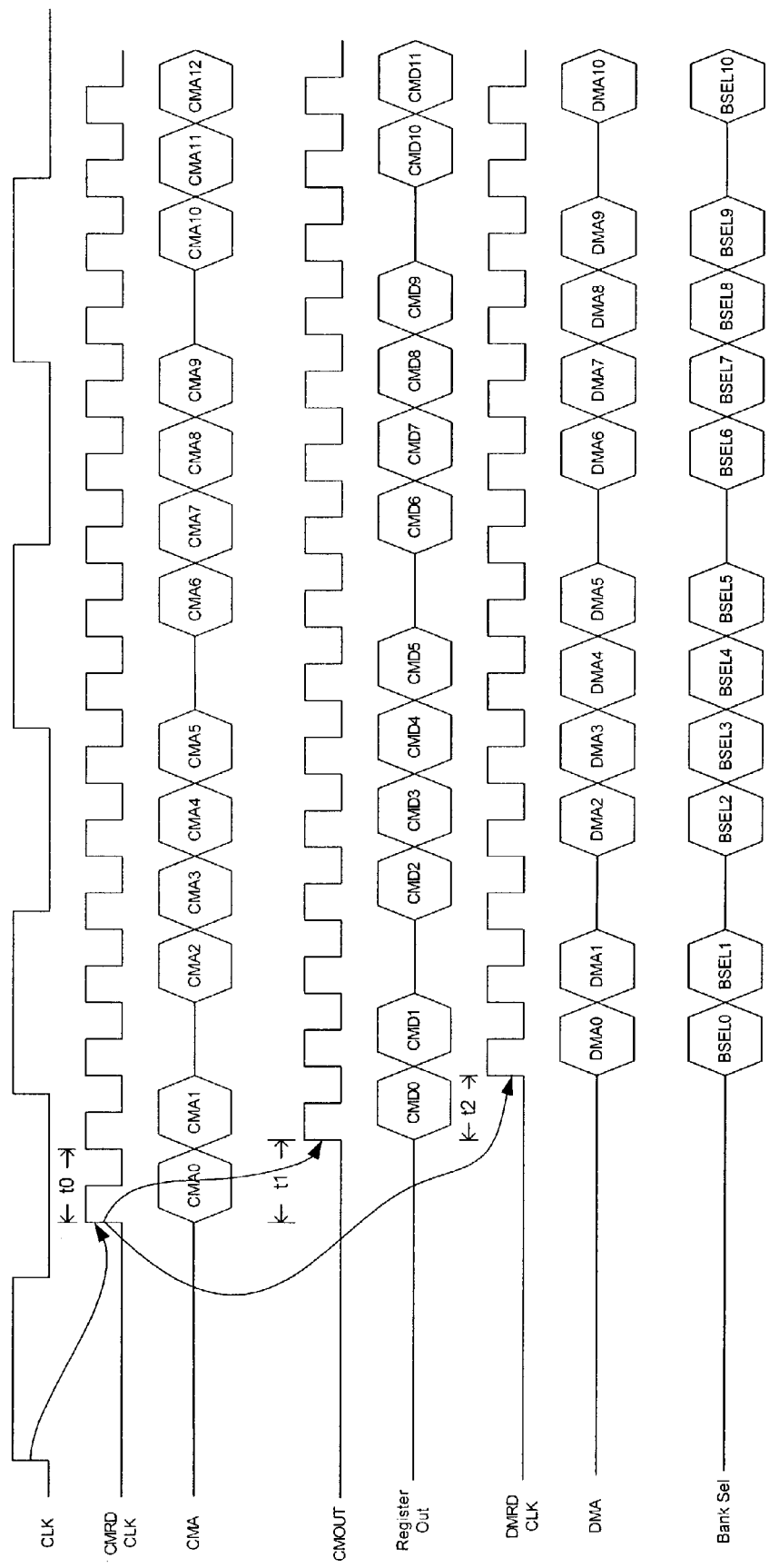
FIG. 5 is a timing diagram illustrating operations of the read pipeline of FIG. 4.

FIG. 5 is a timing diagram illustrating address generation for non-microprocessor reads of the data memory 120. FIG. 5 illustrates such operations for embodiments of the present invention that provide 5 internal clock cycles for each external clock cycle. Furthermore, an initial one of the five clock cycles after the beginning of each external clock cycle is reserved for microprocessor access. In FIG. 5, the external clock is labeled CLK, the clock which clocks the register 320 is labeled CMRD CLK, the output of register 320 is labeled CMA, the clock for the register 345 is labeled CMOUT, the output of the register 345 is labeled Register Out, the clock for the bank register 370 and the register 375 is labeled DMRD CLK, the output of the register 375 is labeled DMA and the output of the bank register 370 is labeled Bank Sel.

Turning to the specifics of FIG. 5, the CMRD CLK is substantially synchronized with the external CLK such that respective periods of the CMRD CLK have a constant relationship with the external clock CLK. Such synchronization may be provided by a phase or delay locked loop or may be periodically provided by, for example, resetting an oscillator. Thus, for example, an oscillator may be timed to an external clock and reset periodically, such as, for example, every 5 cycles. The period of the CMRD CLK is illustrated as t0 in FIG. 5. As is further seen in FIG. 5, the CMRD CLK clocks the register 320 every t0 to clock the connection memory address data CMA0 . . . CMAn into the register 320. The break in the data of CMA, for example, between CMA1 and CMA2, is illustrated in FIG. 5 to reflect the microprocessor access. When data is clocked into the register 320 the read of the connection memory 130 begins. Thus, the beginning of a period of CMRD CLK reflect the beginning of operations of the first pipeline stage 385 of FIG. 4.

The second pipeline stage 390 begins with the beginning of a period of CMOUT which clocks the output of the connection memory 130 into the register 345. CMOUT begins a time t1 after the initiation of a corresponding period of CMRD CLK. The CMOUT clock clocks the register 345 to clock the connection memory data CMD0 . . . CMDn into the register 345. The break in the data of Register Out, for example, between CMD1 and CMD2, is illustrated in FIG. 5 to reflect the microprocessor access. When data is clocked into the register 345 the address compare and the predecode of the data subsequently begins. As is seen in FIG. 5, the register 345 provides data to the address comparator 370 and the predecoder 365 (through the multiplexer 360) on successive clock cycles of CMOUT.

The address compare of the address comparator 355 and the predecode of the predecoder 365 preferably take less time than the read of the connection memory 130. Thus, the time allowed for operations in the second pipeline stage 390 may be reduced so as to increase the time provided for completion of operations of the first pipeline stage 385. This may be accomplished by delaying the clock CMOUT with respect to CMRD CLK to increase the duration allowed for operations in the first pipeline stage 385. Thus, as seen in FIG. 5, the period of CMOUT may be the same as the period of CMRD CLK, however CMOUT may be a delayed version of CMRD CLK so that the time t1 may be greater than the time t0. In such a way, the duration of the first pipeline stage 385 may be extended so as to provide additional time for the read of the connection memory 130.

Furthermore, by the-addition of the second pipeline stage 390, the predecode of the data memory address may be moved to before the data memory address register 375. By moving the predecode the time required for the third pipeline stage 395 may be reduced, thus reducing the likelihood that the data memory access of the third pipeline stage 395 becomes a critical timing path.

The third pipeline stage 395 begins with the beginning of the clock DMRD CLK that clocks data into the bank register 370 and the register 375. The clock DMRD CLK clocks the bank register 370 and the register 375 to clock the bank select BSEL0 . . . BSELn into the bank select register 370 and the data memory address DMA0 . . . DMAn into the register 375. The break in the data of DMA, for example, between DMA1 and DMA2, and the break in the data of Bank Sel, for example, between BSEL1 and BSEL2, are illustrated in FIG. 5 to reflect the microprocessor access. When data is clocked into the bank register 370 and the register 375 the read of the data memory 120 begins.

The clock DMRD CLK is not delayed with respect to the CMRD CLK and, thus, the time t2, which is the duration of the second pipeline stage 390, may be less than the time t0. Thus, the duration of the time allowed for operations in the second pipeline stage 390 may be reduced, thereby increasing the time for operations in the first pipeline stage 385, by delaying the start of the second pipeline stage 390. Furthermore, the duration of the third pipeline stage 395 may be unaffected by such changes because the start of the third pipeline stage 395 may be maintained in relation to the start of the first pipeline stage 385.

By providing an additional pipeline stage (provided by the register 345), the cycle time of the TSI switch 100 may be improved as the internal cycle time of reads of the connection memory 130 may be increased while maintaining the overall cycle time of the address generation for reads of the data memory. By, in effect, starting the read operation a cycle before the data would otherwise be required at the data memory the allowable duration for the read may be increased without effecting the overall time to traverse the pipeline. Such techniques may also be utilized in combination with one or more of increasing the memory size to allow more parallel operations and/or delaying the data memory address clock (DMRD CLK) and/or parallel to serial conversion clocks to provide additional time for address generation. Delaying the DMRD CLK and/or the parallel to serial conversion clocks may, however, be limited by the timing margin available with respect to the external clock CLK.

While the present invention has been described with reference to data memory address generation utilizing a system which provides microprocessor access, the present invention should not be construed as limited to such embodiments. For example, if microprocessor access is not desired, or is provided by another mechanism, the multiplexers 310, 350 and 340 may be eliminated from the circuit of FIG. 4. Similarly, the MPU address buffer 305 and the temporary register 330 may also be eliminated. Furthermore, the temporary register 330 may also be eliminated by controlling access to the data memory during microprocessor accesses, for example, through the gating and/or control of clocks utilized for such accesses. Accordingly, embodiments of the present invention should not be construed as limited to the particular configurations illustrated in FIG. 4.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A time-slot interchange switch, comprising:
   a pipelined data memory address generation circuit, the data memory address generation circuit comprising:

a first pipeline stage that reads data from a connection memory;

a second pipeline stage that compares the data read from the connection memory to a write pointer location to provide a bank selection value; and a third pipeline stage that reads data from a data memory based on the bank selection value and the data read from connection memory.

2. The time-slot interchange switch of claim 1, wherein the first pipeline stage comprises:

a first register that receives a read address and stores the read address during a first clock cycle; and a decoder that decodes the read address stored in the first register and provides a decoded read address to the connection memory.

3. The time-slot interchange switch of claim 2, wherein the second pipeline stage comprises:

a second register that receives an output of the connection memory and stores the output of the connection memory during a second clock cycle; and an address comparator that compares the output of the connection memory stored in the second register to a current write address value of the data memory and provides results of the comparison as a bank select value to the third pipeline stage.

4. The time-slot interchange switch of claim 3, wherein the second pipeline stage further comprises a predecoder that predecodes the output of the connection memory stored in the second register and provides the predecoded results to the third pipeline stage.

5. The time-slot interchange switch of claim 4, wherein the third pipeline stage comprises:

a bank select register that receives the bank select value and stores the bank select value during a third clock cycle and provides the stored bank select value to the data memory;

a third register that receives the predecoded results and stores the predecoded results during the third clock cycle; and a decoder that decodes the predecoded results stored in the third register to provide an address to the data memory.

6. The time-slot interchange switch of claim 3, further comprising a timing circuit that provides the first clock cycle and the second clock cycle such that a duration between the first clock cycle and the second clock cycle is greater than a duration between a first occurrence of the first clock cycle and next subsequent occurrence of the first clock cycle.

7. The time-slot interchange switch of claim 5, further comprising a timing circuit that provides the first clock cycle, the second clock cycle and the third clock cycle, wherein a duration from the first clock cycle to the second clock cycle is greater than a duration from the second clock cycle to the third clock cycle.

8. The time-slot interchange switch of claim 5, wherein the third clock cycle is about two periods of the first clock cycle after initiation of the first clock cycle.

9. The time-slot interchange switch of claim 5, wherein the third clock cycle is more than two periods of the first clock cycle after initiation of the first clock cycle.

10. The time-slot interchange switch of claim 3, further comprising a temporary register that receives and stores the output of the connection memory and selectively provides the stored output of the connection memory to the second register.

11. The time-slot interchange switch of claim 3, further comprising a data memory counter that provides the current write address of the data memory to the address comparator.

12. A data memory address generation circuit of a time-slot interchange switch, comprising:

a connection memory;

a data memory counter;

an address comparator that compares a value read from the connection memory with a value from the data memory counter;

a first register operably associated with the connection memory to store a value read from the connection memory and provide stored connection memory values on subsequent clock cycles to the address comparator;

a second register operably associated with the first register that stores a value based on the value stored in the first register;

a data memory address decode circuit operably associated with the second register to receive a value stored in the second register and provide a decoded address to a data memory; and a bank register operably associated with the address comparator that stores the output of the address comparator and provides the stored value to the data memory.

13. The data memory address generation circuit of claim 12 further comprising a multiplexer operably associated with the data memory counter and the first register to selectively provide one of an output of the data memory counter and the value stored in the first register to provide a value on which the value stored in the second register is based.

14. The data memory address generation circuit of claim 13, further comprising a predecoder operably associated with the multiplexer and the second register to provide a value stored in the second register.

15. The data memory address generation circuit of claim 12, further comprising:

a connection memory address register that stores a connection memory address;

a connection memory address decode circuit operably associated with the connection memory and the connection memory address register that receives the stored connection memory address for reading the connection memory.

16. The data memory address generation circuit of claim 15, further comprising a connection memory read counter that provides the connection memory address.

17. The data memory address generation circuit of claim 15, further comprising a clocking circuit that provides a first clock that clocks the connection memory address register, a second clock that clocks the first register and a third clock that clocks the second register.

18. The data memory address generation circuit of claim 17, wherein the clocking circuit is configured so that a corresponding third clock clocks the second register about two periods of the first clock after initiation of a corresponding occurrence of the first clock.

19. The data memory address generation circuit of claim 17, wherein the clocking circuit is configured so that a time from initiation of a first occurrence of the first clock to a corresponding initiation of the second clock and is greater than a period of the first clock.

20. The data memory address generation circuit of claim 19, wherein the clocking circuit is configured so that a time from the initiation of the second clock to a corresponding initiation of the third clock is less than the time from initiation of a first occurrence of the first clock to a corresponding initiation of the second clock and is greater than a period of the first clock.

21. The data memory address generation circuit of claim 20, wherein the clocking circuit is configured so that the time from the initiation of the second clock to a corresponding initiation of the third clock is less than a period of the first clock.

22. The data memory address generation circuit of claim 12, further comprising:
a temporary register operably associated with the connection to store values read from the connection memory; and
a multiplexer configured to selectively provide an output of the temporary register or an output of the connection memory to the first register.

23. A method of generating an address for accessing a data memory of a time-slot interchange switch, comprising:
generating an address for accessing the data memory utilizing at least two pipeline stages, wherein a first of the at least two pipeline stages reads data from a connection memory and a second of the two pipeline stages provides a comparison of the data read from the connection memory; and
wherein the first of the two pipeline stages carries out the steps of:
storing a connection memory read address in a first register utilizing a first clock;
decoding the connection memory read address stored in the first register during a period of the first clock to provide a decoded connection memory read address; and
reading data from the connection memory utilizing the decoded connection memory read address during the period of the first clock.

24. The method of claim 23, wherein the second of the two pipeline stages carries out the steps of:
storing data read from the connection memory in a second register utilizing a second clock; and
generating a bank select value by comparing the data stored in the second register with a current data memory write address.

25. The method of claim 24, wherein the second of the two pipeline stages further carries out the step of predecoding the data stored in the second register to provide a predecoded data memory read address.

26. The method of claim 24, wherein the step of storing data read from the connection memory in a second register utilizing a second clock comprises storing data read from the connection memory in a second register utilizing a second clock that is initiated more than the period of the first clock after initiation of the first clock.

27. The method of claim 25, wherein a third pipeline stage carries out the steps of:
storing the bank select value in a bank select register utilizing a third clock;
storing the predecoded data memory read address in a third register utilizing the third clock;
decoding the predecoded data memory read address stored in the third register to provide a decoded data memory read address during a period of the third clock; and
reading the data memory utilizing the stored bank select value and the decoded data memory read address during the period of the third clock.

28. The method of claim 27, wherein the step of storing data read from the connection memory in a second register utilizing a second clock comprises storing data read from the connection memory in a second register utilizing a second clock that is initiated more than the period of the first clock after initiation of the first clock; and
wherein the steps of storing the bank select value and storing the predecoded data memory read address comprise storing the bank select value and the predecoded data memory read address utilizing a third clock that is initiated about two periods of the first clock after initiation of the first clock.

29. The method of claim 24, further comprising:
storing data read from the connection memory in a temporary register; and
selectively providing the data stored in the temporary register to the second register.

30. A system for generating an address for accessing a data memory of a time-slot interchange switch, comprising:
a connection memory; and
means for generating an address for accessing the data memory utilizing at least two pipeline stages, wherein a first of the at least two pipeline stages reads data from the connection memory and a second of the two pipeline stages provides a comparison of the data read from the connection memory; and
wherein the first of the two pipeline stages comprises:
means for storing a connection memory read address in a first register utilizing a first clock;
means for decoding the connection memory read address stored in the first register during a period of the first clock to provide a decoded connection memory read address; and
means for reading data from the connection memory utilizing the decoded connection memory read address during the period of the first clock.

31. The system of claim 30, wherein the second of the two pipeline stages comprises:
means for storing data read from the connection memory in a second register utilizing a second clock; and
means for generating a bank select value by comparing the data stored in the second register with a current data memory write address.

32. The system of claim 31, wherein the means for storing data read from the connection memory in a second register utilizing a second clock comprises means for storing data read from the connection memory in a second register a second clock that is initiated more than the period of the first clock after initation of the first clock.

33. The system of claim 31, wherein the means for storing data read from the connection memory in a second register utilizing a second clock comprises means for storing data read from the connection memory in a second register utilizing a second clock that is initiated more than the period of the first clock after initiation of the first clock.

34. The system of claim 32, further comprising a third pipeline stage, the third pipeline stage comprising:
means for storing the bank select value in a bank select register utilizing a third clock;
means for storing the predecoded data memory read address in a third register utilizing the third clock;
means for decoding the predecoded data memory read address stored in the third register to provide a decoded data memory read address during a period of the third clock; and
means for reading the data memory utilizing the stored bank select value and the decoded data memory read address during the period of the third clock.

35. The system of claim 34, wherein the means for storing data read from the connection memory in a second register utilizing a second clock comprises means for storing data read from the connection memory in a second register utilizing a second clock that is initiated more than the period of the first clock after initiation of the first clock; and wherein the means for storing the bank select value and the means for storing the predecoded data memory read address comprise means for storing the bank select value and the predecoded data memory read address utilizing a third clock that is initiated about two periods of the first clock after initiation of the first clock.

36. The system of claim 31, further comprising:

means for storing data read from the connection memory in a temporary register; and means for selectively providing the data stored in the temporary register to the second register.

37. A time-slot interchange switch, comprising:

a connection memory;

a data memory;

a connection-to-data memory pipeline having at least first and second stages therein that are synchronized with a clock signal and consecutively traversed during first and second time intervals, the first and second time intervals having a duration greater than T and less than T respectively, where T is a period of the clock signal.

38. The time-slot interchange switch of claim 37, wherein a sum of the duration of the first time interval and the duration of the second time interval equals 2T.

39. The time-slot interchange switch of claim 38, wherein the connection-to-data memory pipeline has three stages that are synchronized to the clock signal.

* * * * *

UNITED STATES PATENT AND TRADEMARK OFFICE
CERTIFICATE OF CORRECTION

| | | |
|---|---|---|
| PATENT NO. | : 7,257,115 B2 | Page 1 of 1 |
| APPLICATION NO. | : 10/205177 | |
| DATED | : August 14, 2007 | |
| INVENTOR(S) | : Frank Matthews et al. | |

It is certified that error appears in the above-identified patent and that said Letters Patent is hereby corrected as shown below:

Column 14, lines 43 through 48 - delete Claim 32, which is a duplicate of Claim 33, and add Claim 32 as follows:

32.    The system of Claim 31, wherein the second of the two pipeline stages further comprises means for predecoding the data stored in the second register to provide a predecoded data memory read address.

Signed and Sealed this

Twenty-third Day of October, 2007

JON W. DUDAS
*Director of the United States Patent and Trademark Office*